US010854543B2

(12) United States Patent
Takizawa et al.

(10) Patent No.: US 10,854,543 B2
(45) Date of Patent: Dec. 1, 2020

(54) SEMICONDUCTOR DEVICE AND MANUFACTURING METHOD THEREFOR

(71) Applicant: DENSO CORPORATION, Kariya, Aichi-pref. (JP)

(72) Inventors: Shin Takizawa, Kariya (JP); Takashi Nakano, Kariya (JP)

(73) Assignee: DENSO CORPORATION, Kariya (JP)

( * ) Notice: Subject to any disclaimer, the term of this patent is extended or adjusted under 35 U.S.C. 154(b) by 61 days.

(21) Appl. No.: 15/502,244

(22) PCT Filed: Oct. 2, 2015

(86) PCT No.: PCT/JP2015/005036
§ 371 (c)(1),
(2) Date: Feb. 7, 2017

(87) PCT Pub. No.: WO2016/056212
PCT Pub. Date: Apr. 14, 2016

(65) Prior Publication Data
US 2017/0256505 A1    Sep. 7, 2017

(30) Foreign Application Priority Data

Oct. 7, 2014   (JP) .................................. 2014-206425
Sep. 8, 2015   (JP) .................................. 2015-176741

(51) Int. Cl.
*H01L 23/522*   (2006.01)
*H01L 27/01*    (2006.01)
(Continued)

(52) U.S. Cl.
CPC ......... *H01L 23/5228* (2013.01); *H01C 7/006* (2013.01); *H01L 23/564* (2013.01);
(Continued)

(58) Field of Classification Search
CPC ..... H01L 23/5228; H01L 28/20; H01L 28/24; H01L 27/0802; H01L 27/016; H01L 27/101; H01C 7/006
See application file for complete search history.

(56) References Cited

U.S. PATENT DOCUMENTS 5,428,242 A *  6/1995  Furuya .................. H01L 23/585
                                                                257/538
7,403,094 B2   7/2008  Beach et al.
(Continued)

FOREIGN PATENT DOCUMENTS

JP          11-145388 A      5/1999
JP       2004-039925 A      2/2004
(Continued)

*Primary Examiner* — Jose R Diaz
(74) *Attorney, Agent, or Firm* — Posz Law Group, PLC

(57) ABSTRACT

A semiconductor device includes: a substrate; a first wiring layer arranged above the substrate; a first insulating film covering the first wiring layer; a lower oxidation preventing film arranged on the first insulating film; at least one thin-film resistor arranged on the lower oxidation preventing film; an upper oxidation preventing film arranged on the at least one thin-film resistor; a second insulating film covering the lower oxidation preventing film, the at least one thin-film resistor, and the upper oxidation preventing film; a second wiring layer arranged on the second insulating film; and a third insulating film covering the second wiring layer. The first wiring layer overlaps an end portion of the at least one thin-film resistor when viewed in a normal direction of one surface of the substrate.

4 Claims, 15 Drawing Sheets

(51) Int. Cl.
  *H01C 7/00* (2006.01)
  *H01L 27/08* (2006.01)
  *H01L 27/10* (2006.01)
  *H01L 49/02* (2006.01)
  *H01L 23/00* (2006.01)

(52) U.S. Cl.
  CPC ........ *H01L 27/016* (2013.01); *H01L 27/0802* (2013.01); *H01L 27/101* (2013.01); *H01L 28/20* (2013.01); *H01L 28/24* (2013.01)

(56) References Cited

U.S. PATENT DOCUMENTS

| | | | | |
|---|---|---|---|---|
| 2003/0157811 | A1* | 8/2003 | Ukita | H01L 21/76838 |
| | | | | 438/758 |
| 2004/0125157 | A1* | 7/2004 | Edelen | B41J 2/04521 |
| | | | | 347/9 |
| 2006/0087401 | A1* | 4/2006 | Kerr | H01L 23/5228 |
| | | | | 338/309 |
| 2006/0238292 | A1* | 10/2006 | Beach | H01L 23/5228 |
| | | | | 338/309 |
| 2009/0302993 | A1* | 12/2009 | Fujiwara | H01L 23/5228 |
| | | | | 338/314 |
| 2012/0009756 | A1 | 1/2012 | Fujiwara et al. | |
| 2013/0168817 | A1 | 7/2013 | Kawahara et al. | |
| 2014/0357047 | A1 | 12/2014 | Kawahara et al. | |

FOREIGN PATENT DOCUMENTS

| JP | 2005-259802 A | 9/2005 |
|---|---|---|
| JP | 2011-061005 A | 3/2011 |
| JP | 2011-146520 A | 7/2011 |

\* cited by examiner

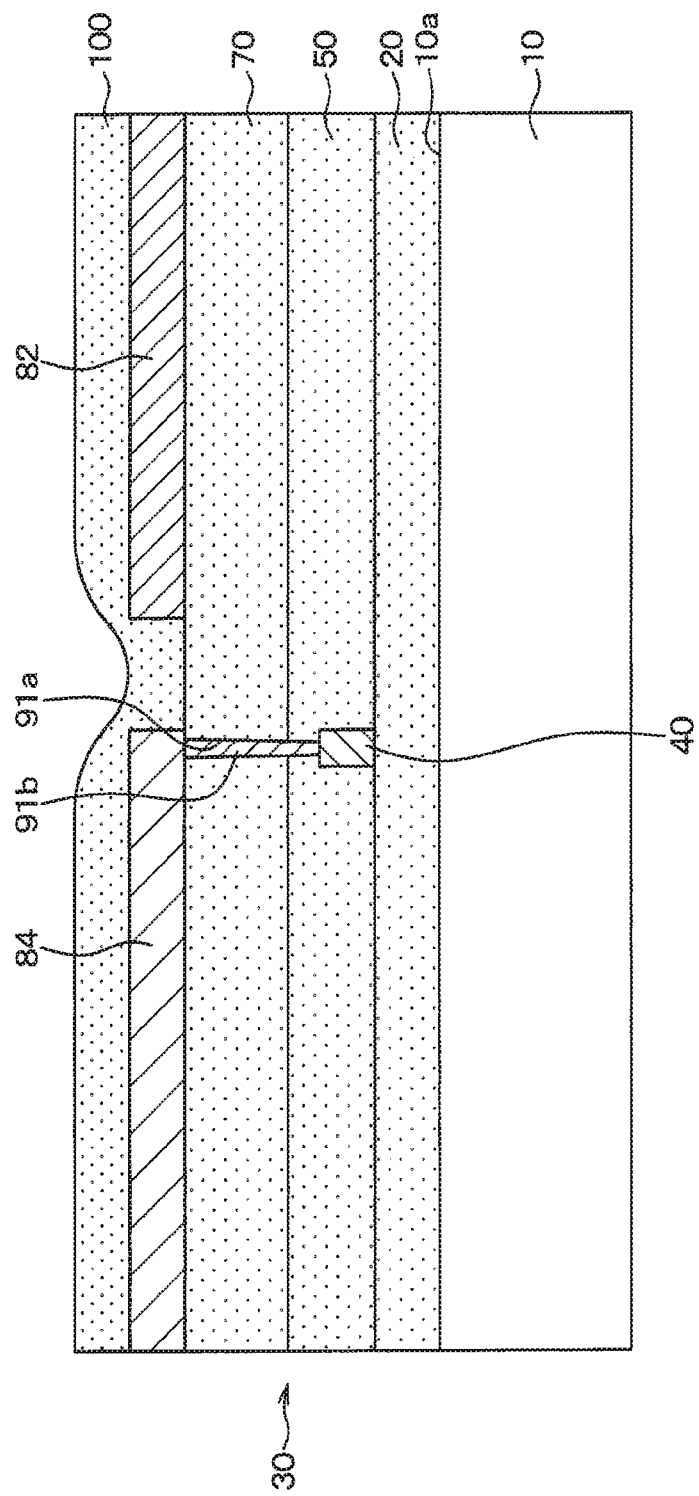

SEMICONDUCTOR DEVICE AND MANUFACTURING METHOD THEREFOR

CROSS REFERENCE TO RELATED APPLICATIONS

This application is a U.S. national stage application of International Patent Application No. PCT/JP2015/005036 filed on Oct. 2, 2015 and is based on Japanese Patent Application No. 2014-206425 filed on Oct. 7, 2014, and No. 2015-176741 filed on Sep. 8, 2015, the disclosures of which are incorporated herein by reference.

TECHNICAL FIELD

The present disclosure relates to a semiconductor device having a thin-film resistor on one surface of a substrate and a manufacturing method of such a semiconductor device.

BACKGROUND ART

A semiconductor device in the related art includes a multi-layer wiring layer formed by laminating wiring layers made of Al or the like, insulating films made of TEOS (Tetra Ethyl Ortho Silicate) or the like, and so on on one surface of a substrate. A thin-film resistor made of CrSi or the like is provided inside the multi-layer wiring layer along a plane direction of the substrate. In the semiconductor device as above, moisture is present in the insulating films made of TEOS or the like. Hence, such moisture migrates when heated during manufacturing of the semiconductor device or depending on environments in which the semiconductor device is used. The semiconductor device in the related art therefore has a problem that the thin-film resistor becomes oxidized when moisture reaches the thin-film resistor and a resistance value of the thin-film resistor varies due to oxidation.

In order to solve the problem, the semiconductor device as above includes a lower oxidation preventing film disposed beneath the thin-film resistor and an upper oxidation preventing film disposed on the thin-film resistor.

In short, the thin-film resistor is sandwiched between the lower oxidation preventing film and the upper oxidation preventing film. Moisture in the insulating films that reaches the thin-film resistor can be thus restricted.

According to the semiconductor device as above, however, when moisture reaches side surfaces of the thin-film resistor exposed from the lower oxidation preventing film and the upper oxidation preventing film, the thin-film resistor may possibly become oxidized from where moisture has reached. In order to solve such a problem, a countermeasure to provide a lateral oxidation preventing film to the side surfaces of the thin-film resistor is proposed in, for example, Patent Literature 1.

The proposed semiconductor device is manufactured as follows. That is, films to be respectively formed into the lower oxidation preventing film, the thin-film resistor, and the upper oxidation preventing film are sequentially deposited on a substrate. The lower oxidation preventing film, the thin-film resistor, and the upper oxidation preventing film are provided by subjecting the respective deposited films to patterning by means of photolithography or the like. Wiring layers and insulating films to be included in the multi-layer wiring layer are also provided appropriately. Subsequently, an oxidation preventing film is provided so as to cover the lower oxidation preventing film, the thin-film resistor, and the upper oxidation preventing film, A lateral oxidation preventing film is provided by subjecting the oxidation preventing film to patterning so as to cover a portion of the thin-film resistor exposed from the lower oxidation preventing film and the upper oxidation preventing film. In the manner as above, the semiconductor device having the lateral oxidation preventing film is manufactured.

The manufacturing method of the semiconductor device as above, however, requires an additional step only to provide the lateral oxidation preventing film. The manufacturing method therefore has a problem that not only the number of steps but also complexity of a manufacturing process increases.

PRIOR ART LITERATURES

Patent Literature

Patent Literature 1: JP-A-2009-302082

SUMMARY

It is an object of the present disclosure to provide a semiconductor device capable of restricting an increase not only in the number of steps but also in complexity of a manufacturing process while restricting oxidation of a thin-film resistor, and a manufacturing method of such a semiconductor device.

According to a first aspect of the present disclosure, a semiconductor device includes: a substrate having one surface; a first wiring layer arranged above the one surface of the substrate; a first insulating film covering the first wiring layer; a lower oxidation preventing film arranged on the first insulating film; at least one thin-film resistor arranged on the lower oxidation preventing film; an upper oxidation preventing film arranged on the at least one thin-film resistor; a second insulating film covering the lower oxidation preventing film, the at least one thin-film resistor, and the upper oxidation preventing film; a second wiring layer arranged on the second insulating film that covers the lower oxidation preventing film, the at least one thin-film resistor, and the upper oxidation preventing film; and a third insulating film covering the second wiring layer. The first wiring layer overlaps an end portion of the at least one thin-film resistor when viewed in a normal direction of the one surface of the substrate.

According to the semiconductor device configured as above, the first wiring layer is disposed in the first insulating film covering the first wiring layer in portions near side surfaces of the thin-film resistor. Hence, in comparison with a case where the first wiring layer is not disposed in the portions specified above, moisture does not migrate from the portions specified above in times such as when the semiconductor device is in use and moisture that reaches the side surfaces of the thin-film resistor can be restricted. Consequently, oxidation on the side surfaces of the thin-film resistor can be restricted, which can in turn restrict a variance in resistance value of the thin-film resistor.

According to a second aspect of the present disclosure, a manufacturing method of a semiconductor device that includes: a substrate having one surface; a first wiring layer arranged above the one surface of the substrate; a first insulating film covering the first wiring layer; a lower oxidation preventing film arranged on the first insulating film; a thin-film resistor arranged on the lower oxidation preventing film; an upper oxidation preventing film arranged on the thin-film resistor; a second insulating film covering the lower oxidation preventing film, the thin-film resistor, and the upper oxidation preventing film; a second wiring layer arranged on the second insulating film that covers the lower oxidation preventing film, the thin-film resistor, and the upper oxidation preventing film; and a third insulating film covering the second wiring layer, the first wiring layer overlapping an end portion of the thin-film resistor when viewed in a normal direction of the one surface of the substrate, the manufacturing method includes: preparing the substrate; forming a metal film to provide the first wiring layer on the substrate; forming the first wiring layer by patterning the metal film; forming the first insulating film that covers the first wiring layer; forming a first oxidation preventing film to provide the lower oxidation preventing film on the first insulating film that covers the first wring; forming a metal film to provide the thin-film resistor on the first oxidation preventing film; forming a second oxidation preventing film to provide the upper oxidation preventing film on the metal film; forming the lower oxidation preventing film, the thin-film resistor, and the upper oxidation preventing film by patterning the first oxidation preventing film, the metal film, and the second oxidation preventing film; forming the second insulating film that covers the lower oxidation preventing film, the thin-film resistor, and the upper oxidation preventing film; forming another metal film to provide the second wiring layer on the second insulating film that covers the lower oxidation preventing film, the thin-film resistor, and the upper oxidation preventing film; and forming the second wiring layer by patterning the another metal film. The forming of the first wiring layer and the forming of the lower oxidation preventing film, the thin-film resistor, and the upper oxidation preventing film are performed to overlap the first wiring layer with the end portion of the thin-film resistor when viewed in a normal direction of the one surface of the substrate.

According to the manufacturing method of the semiconductor device configured as above, the first wiring layer and the thin-film resistor are provided, respectively, in the step of providing the first wiring layer and the step of providing the lower oxidation preventing film, the thin-film resistor, and the upper oxidation preventing film in such a manner that the first wiring layer has a portion overlapping the end portions of the thin-film resistor when viewed in a direction normal to the one surface of the substrate. Hence, in comparison with a case where the first wiring layer is not provided in the portion specified above, moisture does not migrate from the portion specified above when the semiconductor device is manufactured and moisture that reaches side surfaces of the thin-film resistor can be restricted. Consequently, oxidation on the side surfaces of the thin-film resistor can be restricted, which can in turn restrict a variance in resistance value.

According to the manufacturing method configured as above, only a shape of masks used for patterning in the respective steps has to be changed. Hence, oxidation of the thin-film resistor can be restricted without increasing the number of steps and complexity of a manufacturing process.

BRIEF DESCRIPTION OF DRAWINGS

The above and other objects, features and advantages of the present disclosure will become more apparent from the following detailed description made with reference to the accompanying drawings. In the drawings:

FIG. 14 is a sectional view taken along the line XIV-XIV of FIG. 11; and

EMBODIMENTS

Figure 1:
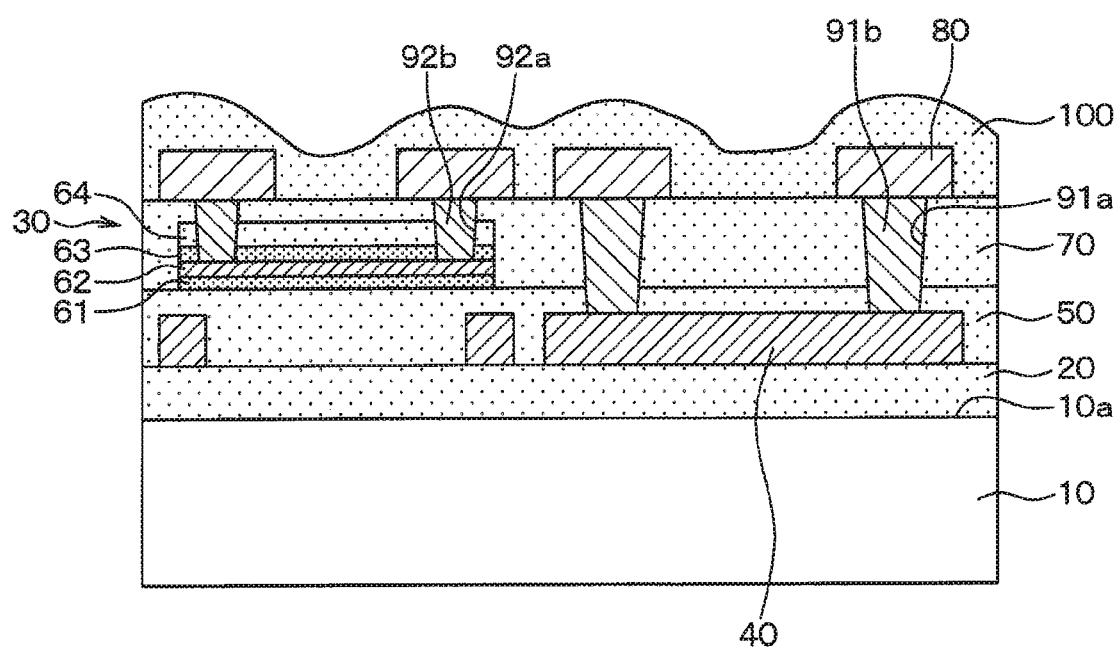
FIG. 1 is a sectional view of a semiconductor device according to a first embodiment of the present disclosure.

Hereinafter, embodiments of the present disclosure will be described according to the drawings. In respective embodiments below, a description will be given by labeling same or equivalent portions with same reference numerals.

First Embodiment

A first embodiment of the present disclosure will be described with reference to the drawings. As is shown in FIG. 1, a semiconductor device has a substrate 10 formed of a silicon substrate or the like and the substrate 10 is provided with unillustrated semiconductor elements, such as diodes and transistors. A multi-layer wiring layer 30 having a thin-film resistor 62 inside is disposed on one surface 10a of the substrate 10 via an oxide film 20.

More specifically, a first wiring layer 40 made of Al, Al—Cu alloy, Cu, W, Ti, Au, Pt, or the like is appropriately patterned and disposed on the oxide film 20. A first insulating film 50 made of TEOS or the like is disposed so as to cover the first wiring layer 40.

In a predetermined region on the first insulating film 50, a lower oxidation preventing film 61, the thin-film resistor 62, an upper oxidation preventing film 63, and a second insulating film 64 are sequentially laminated. In short, the thin-film resistor 62 is disposed while being sandwiched between the lower oxidation preventing film 61 and the upper oxidation preventing film 63. In the present embodiment, the lower oxidation preventing film 61, the thin-film resistor 62, the upper oxidation preventing film 63, and the second insulating film 64 are sequentially deposited and subjected to patterning collectively as will be described below, and therefore formed in a same plane shape.

The lower oxidation preventing film 61 and the upper oxidation preventing film 63 are formed of a nitride film having low moisture permeability. The thin-film resistor 62 is made of CrSi or the like and the second insulating film 64 is made of TEOS or the like. That is to say, the thin-film resistor 62 is disposed so as to prevent penetration of moisture from below (from a side of the substrate 10) and above (from an opposite side to the substrate 10).

Figure 2:
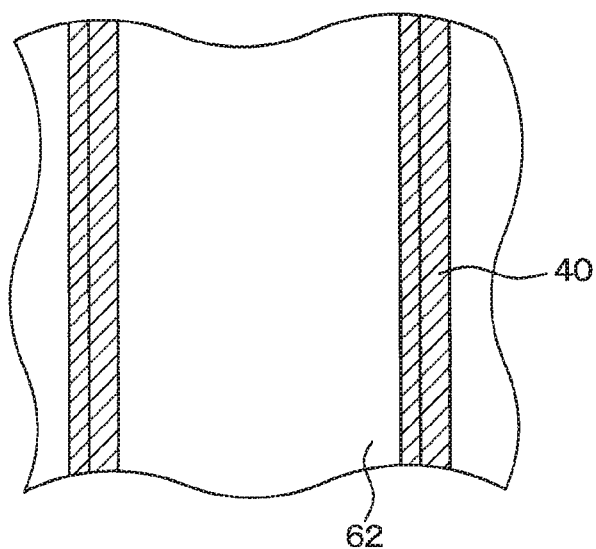
FIG. 2 is a view showing a positional relation of a thin-film resistor and a first wiring layer when viewed in a direction normal to one surface of a substrate.

In the present embodiment, as are shown in FIG. 1 and FIG. 2, the thin-film resistor 62 is provided so as to overlap (intersect with) the first wiring layer 40 at end portions when viewed in a direction normal to the one surface 10*a* of the substrate 10. Conversely, the first wiring layer 40 is provided so as to overlap (intersect with) partially the end portions of the thin-film resistor 62 when viewed in a direction normal to the one surface 10*a* of the substrate 10.

In the present embodiment, the thin-film resistor 62 is provided along one direction (top-bottom direction on a sheet surface of FIG. 2) in a plane direction of the one surface 10*a* of the substrate 10, and the first wiring layer 40 is provided in such a manner that portions overlapping the end portions of the thin-film resistor 62 are aligned along a direction in which the thin-film resistor 62 extends when viewed in a direction normal to the one surface 10*a* of the substrate 10.

In the present embodiment, the first wiring layer 40 is provided so as not to overlap an inner edge portion (for example, a center portion) of the thin-film resistor 62 when viewed in a direction normal to the one surface 10*a* of the substrate 10. FIG. 2 is not a sectional view. However, the first wiring layer 40 is shaded for ease of understanding.

As is shown in FIG. 1, a third insulating film 70 made of TEOS or the like is disposed on the first insulating film 50 so as to cover the lower oxidation preventing film 61, the thin-film resistor 62, the upper oxidation preventing film 63, and the second insulating film 64.

Figure 3:
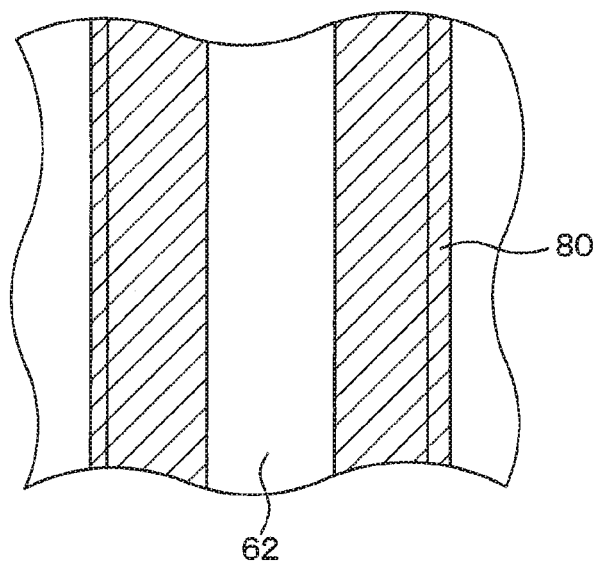
FIG. 3 is a view showing a positional relation of the thin-film resistor and a second wiring layer when viewed in a direction normal to the one surface of the substrate.

An appropriately patterned second wiring layer 80 made of Al or the like is disposed on the third insulating film 70. In the present embodiment, as are shown in FIG. 1 and FIG. 3, the second wiring layer 80 is provided so as to overlap (intersect with) the end portions of the thin-film resistor 62 when viewed in a direction normal to the one surface 10*a* of the substrate 10 in a same manner as the first wiring layer 40. In the present embodiment, the second wiring layer 80 is provided in such a manner that portions overlapping the thin-film resistor 62 are aligned along the direction in which the thin-film resistor 62 extends when viewed in a direction normal to the one surface 10*a* of the substrate 10.

As is shown in FIG. 1, via-holes 91*a* via which to partially expose of the first wiring layer 40 are provided to the first and third insulating films 50 and 70 so as not to penetrate through the thin-film resistor 62. A connection via 91*b* to electrically connect the first wiring layer 40 and the second wiring layer 80 is buried into each via-hole 91*a*. It does not matter whether or not the portions of the first wiring layer 40 overlapping the end portions of the thin-film resistor 62 are electrically connected to portions electrically connected to the second wiring layer 80.

Further, via-holes 92*a* via which to expose an upper surface of the thin-film resistor 62 (a surface of the thin-film resistor 62 on an opposite side to the substrate 10) are provided so as to penetrate through the upper oxidation preventing film 63, the second insulating film 64, and the third insulating film 70. A connection via 92*b* to electrically connect the thin-film resistor 62 and the second wiring layer 80 is buried in each via-hole 92*a*.

A protection film 100 formed of an oxide film or the like to cover the second wiring layer 80 is disposed on the third insulating film 70. In the present embodiment, the protection film 100 corresponds to an insulating film covering a second wiring layer of the present disclosure.

The above has described the configuration of the semiconductor device of the present embodiment. A manufacturing method of the semiconductor device will now be described.

Figure 4A:
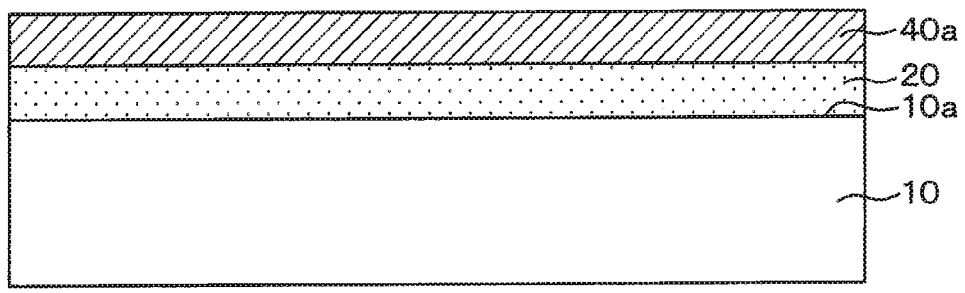
FIG. 4A through FIG. 4D are sectional views showing a manufacturing process of the semiconductor device shown in FIG. 1.
Figure 4B:
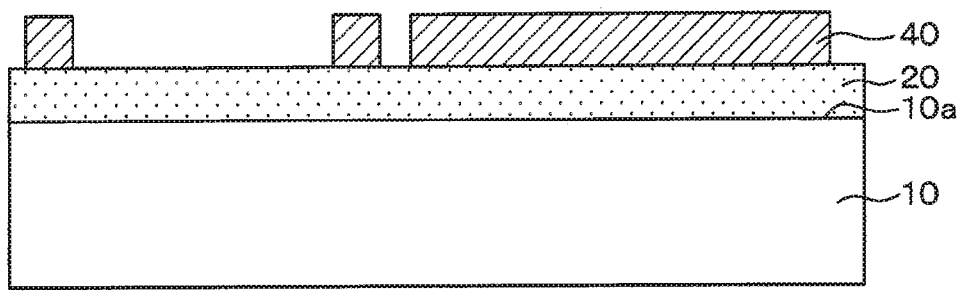

Firstly, as is shown in FIG. 4A, the substrate 10 provided with semiconductor elements, such as diodes and transistors, is prepared and the oxide film 20 is provided on the one surface 10*a* of the substrate 10. A metal film 40*a* is deposited on the oxide film 20 by means of CVD (Chemical Vapor Deposition), PVD (Physical Vapor Deposition), or the like. Subsequently, as is shown in FIG. 4B, the first wiring layer 40 is provided by subjecting the metal film 40*a* to patterning by means of photolithography or the like using a predetermined mask.

Figure 4C:
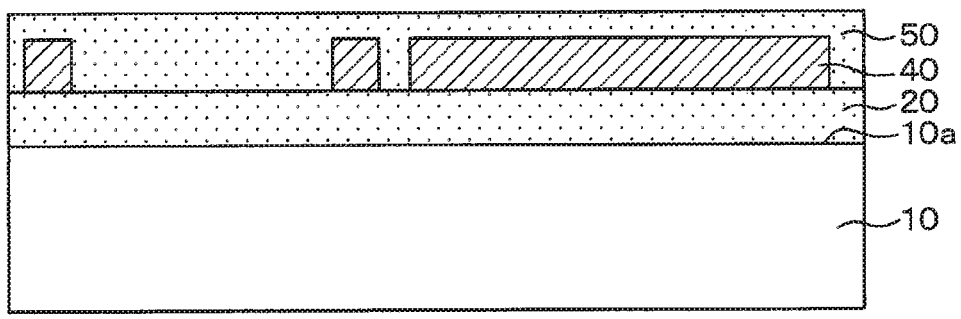
Figure 4D:
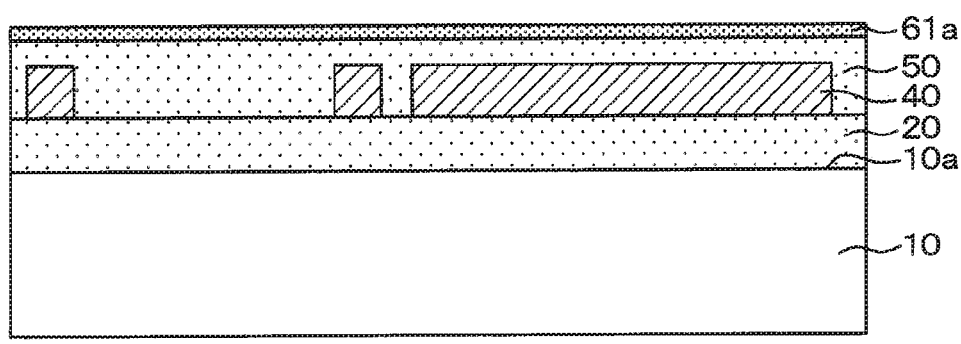

Subsequently, as is shown in FIG. 4C, the first insulating film 50 is provided by depositing a film of TEOS or the like so as to cover the first wiring layer 40 and densifying the deposited film by heating. Subsequently, as is shown in FIG. 4D, a nitride film 61*a* to be formed into the lower oxidation preventing film 61 is deposited on the first insulating film 50.

Figure 5A:
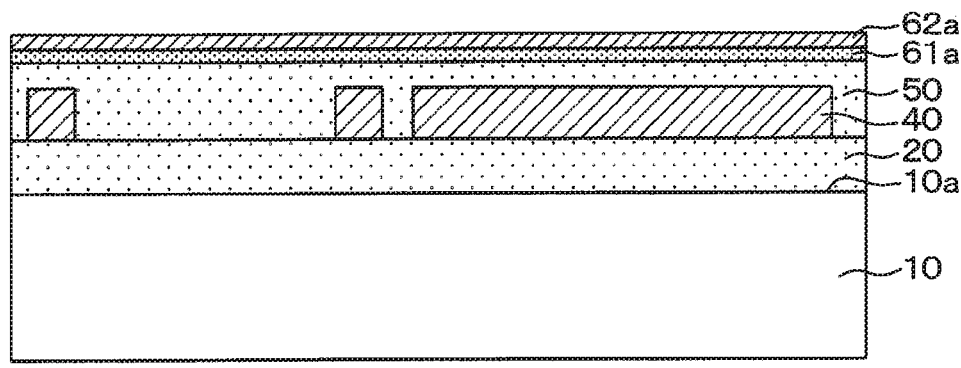
FIG. 5A through FIG. 5D are sectional views showing the manufacturing process of the semiconductor device continued from FIG. 4D.
Figure 5B:
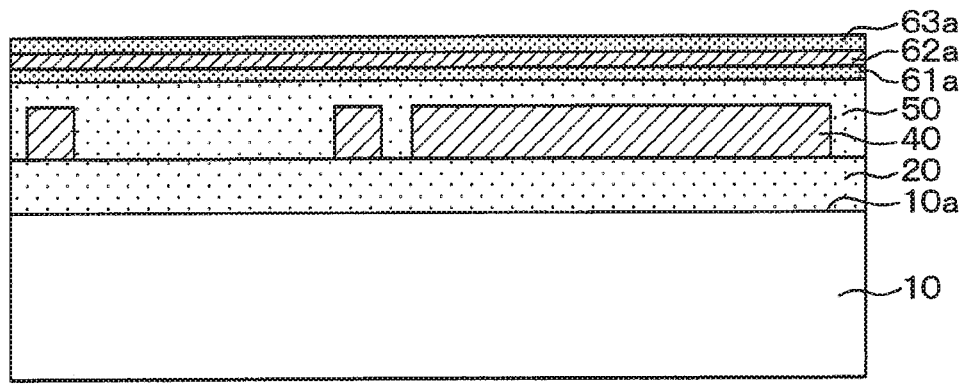
Figure 5C:
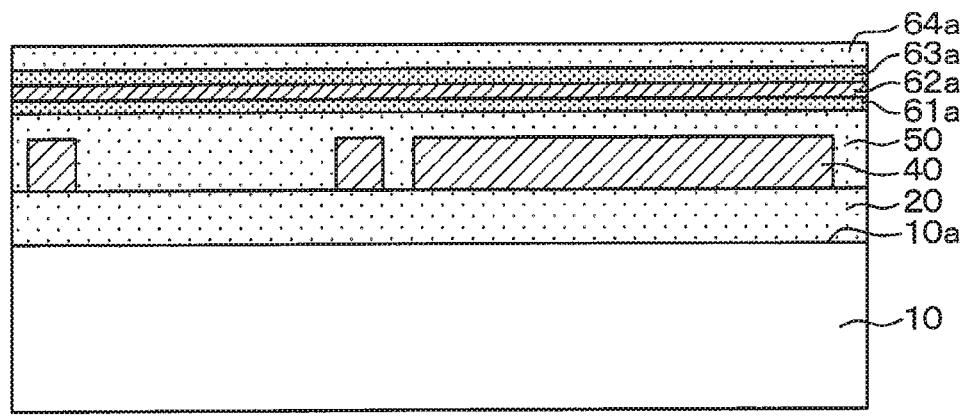

After a metal film 62*a* to be formed into the thin-film resistor 62 is deposited on the nitride film 61*a* as is shown in FIG. 5A, a nitride film 63*a* to be formed into the upper oxidation preventing film 63 is deposited as is shown in FIG. 5B. In the present embodiment, the nitride film 61*a* corresponds to a first oxidation preventing film of the present disclosure and the nitride film 63*a* corresponds to a second oxidation preventing film of the present disclosure. Subsequently, as is shown in FIG. 5C, an insulating film 64*a* is provided by deposing a film of TEOS or the like on the nitride film 63*a* and densifying the deposited film by heating.

Figure 5D:
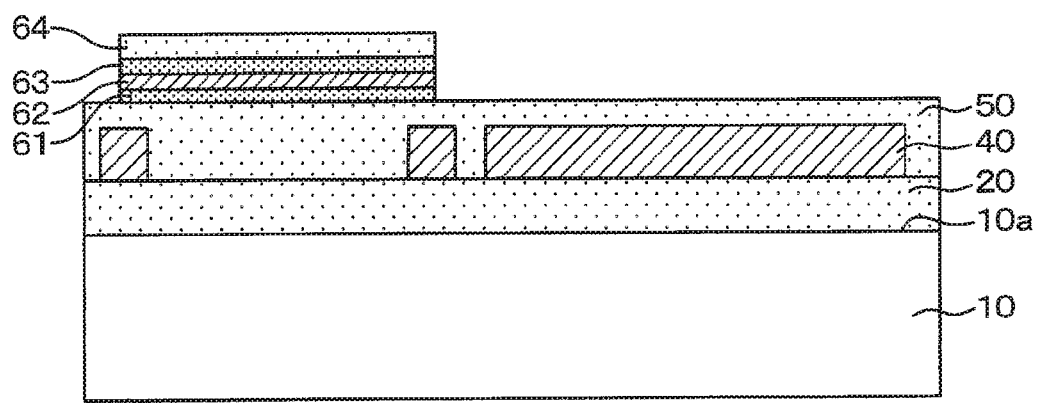

Subsequently, as is shown in FIG. 5D, the lower oxidation preventing film 61, the thin-film resistor 62, the upper oxidation preventing film 63, and the second insulating film 64 are provided by collectively subjecting the nitride film 61*a*, the metal film 62*a*, the nitride film 63*a*, and the insulating film 64*a* to patterning by means of photolithography or the like using a predetermined mask. That is to say, as has been described above, the thin-film resistor 62 is provided in such a manner that the thin-film resistor 62 overlaps the first wiring layer 40 at the end portions when viewed in a direction normal to the one surface 10*a* of the substrate 10. In other words, the first wiring layer 40 and the thin-film resistor 62 are provided, respectively, in the step of FIG. 4B and the step of FIG. 5D in such a manner that the thin-film resistor 62 partially overlaps the first wiring layer 40 at the end portions when viewed in a direction normal to the one surface 10*a* of the substrate 10.

Figure 6A:
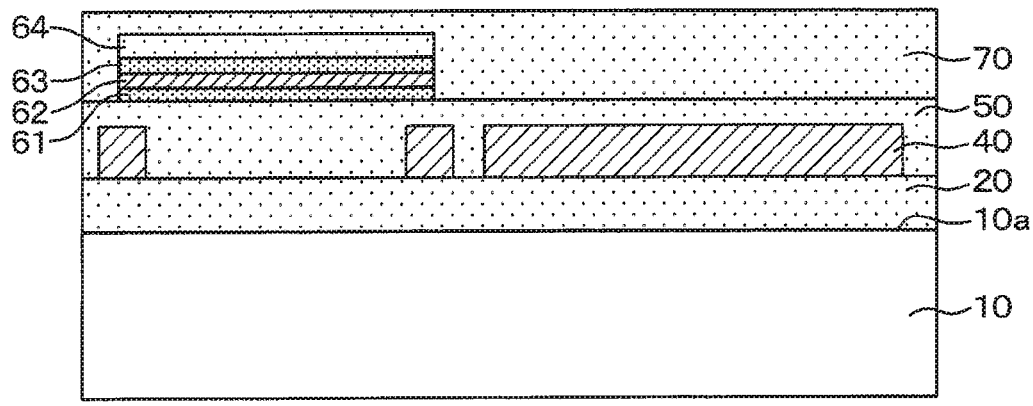
FIG. 6A through FIG. 6C are sectional views showing the manufacturing process of the semiconductor device continued from FIG. 5D.

Subsequently, as is shown in FIG. 6A, the third insulating film 70 is provided by depositing a film of TEOS or the like so as to cover the lower oxidation preventing film 61, the thin-film resistor 62, the upper oxidation preventing film 63, and the second insulating film 64 and densifying the deposited film by heating.

Herein, side surfaces of the thin-film resistor 62 are exposed from the lower oxidation preventing film 61 and the upper oxidation preventing film 63. Hence, the side surfaces may possibly become oxidized when moisture contained in the first insulating film 50 migrates. In the present embodiment, however, it should be noted that the thin-film resistor 62 overlaps the first wiring layer 40 at the end portions when viewed in a direction normal to the one surface 10a of the substrate 10. That is to say, the first wiring layer 40 is disposed in the first insulating film 50 in portions near the side surfaces of the thin-film resistor 62. Hence, in comparison with a case where the first wiring layer 40 is not disposed in the portions specified above, moisture does not migrate from the portions specified above and moisture that reaches the side surfaces of the thin-film resistor 62 can be restricted, which can in turn restrict oxidation on the side surfaces of the thin-film resistor 62.

Figure 6B:
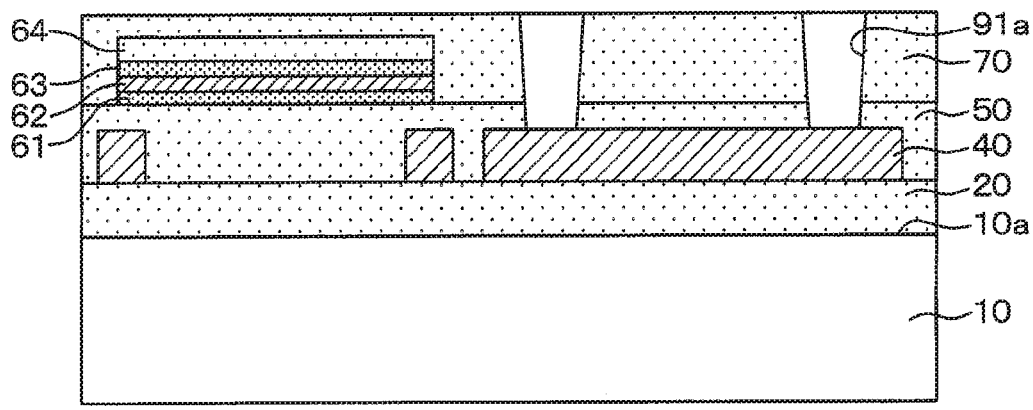

Subsequently, as is shown in FIG. 6B, the via-holes 91a via which to partially expose the first wiring layer 40 are provided so as to penetrate through the first and third insulating films 50 and 70.

Figure 6C:
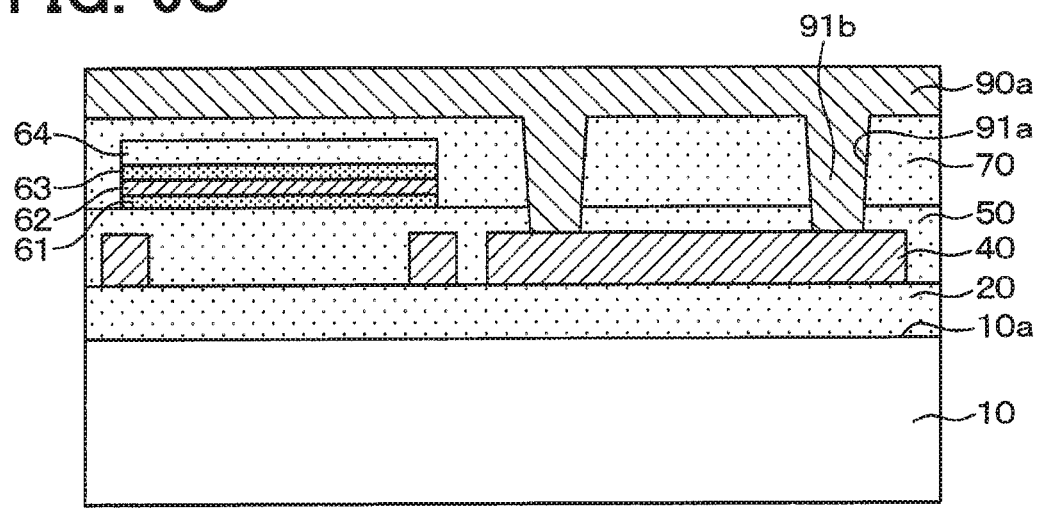

Subsequently, as is shown in FIG. 6C, the connection vias 91b are provided by deposing a metal film 90a so as to bury the respective via-holes 91a. The step of FIG. 6C is performed in a hot environment. Hence, as with the step of FIG. 6A, moisture in the first insulating film 50 may possibly migrate. However, as has been described, oxidation of the thin-film resistor 62 can be restricted by the first wiring layer 40.

Figure 7A:
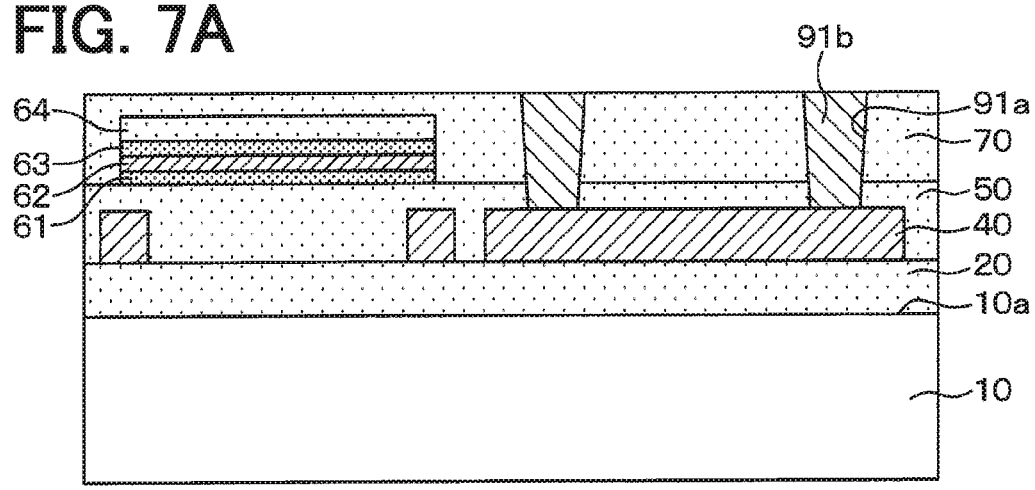
FIG. 7A through FIG. 7C are sectional views showing the manufacturing process of the semiconductor device continued from FIG. 6C.
Figure 7B:
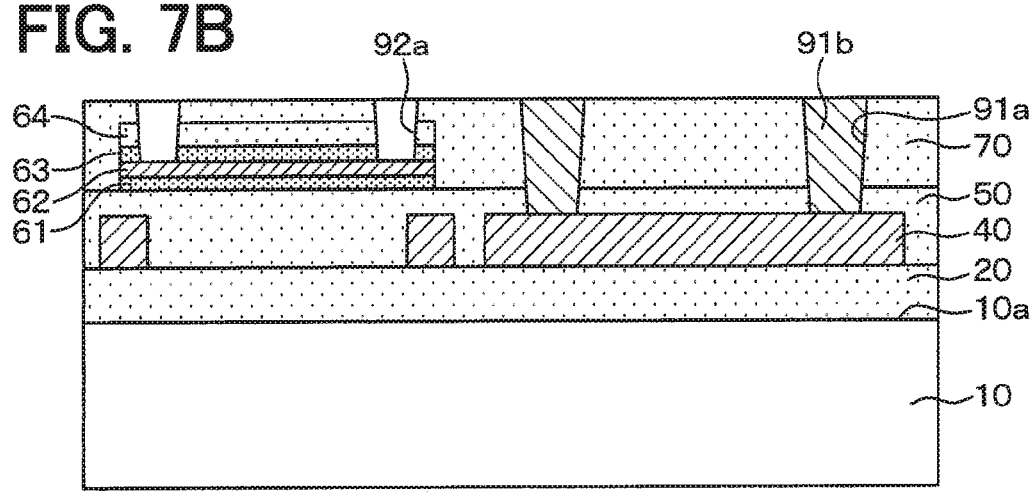

Subsequently, as is shown in FIG. 7A, the metal film 90a on the third insulating film 70 is removed by means of etch-back or the like. Subsequently, as is shown in FIG. 7B, the via-holes 92a via which to expose the upper surface of the thin-film resistor 62 are provided so as to penetrate through the upper oxidation preventing film 63 and the second and third insulating films 64 and 70.

Figure 7C:
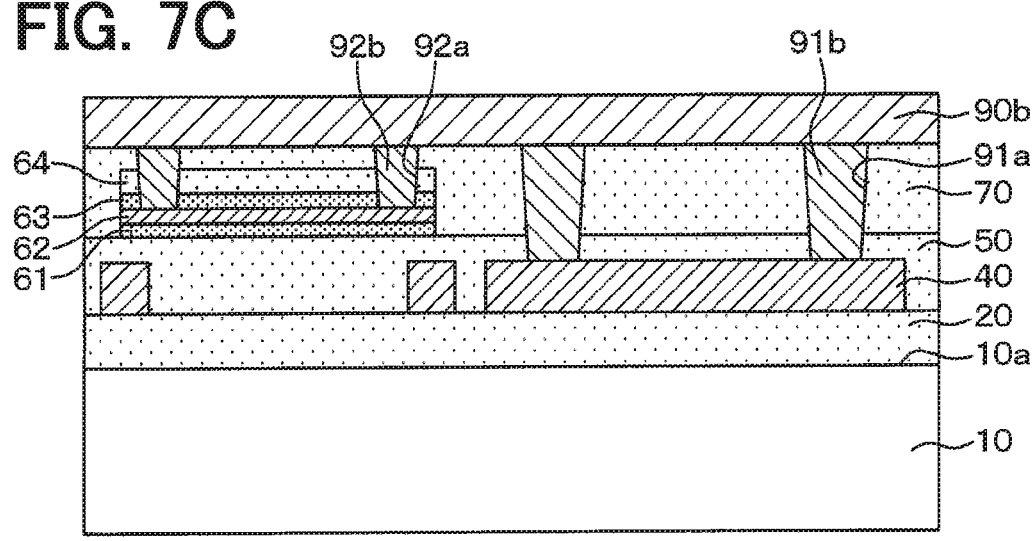

As is shown in FIG. 7C, the connection vias 92b are provided by depositing a metal film 90b so as to bury the respective via-holes 92a. The step of FIG. 7C is performed in a hot environment. Hence, as with the step of FIG. 6A, moisture in the first insulating film 50 may possibly migrate. However, as has been described above, oxidation of the thin-film resistor 62 is restricted by the first wiring layer 40.

Figure 8A:
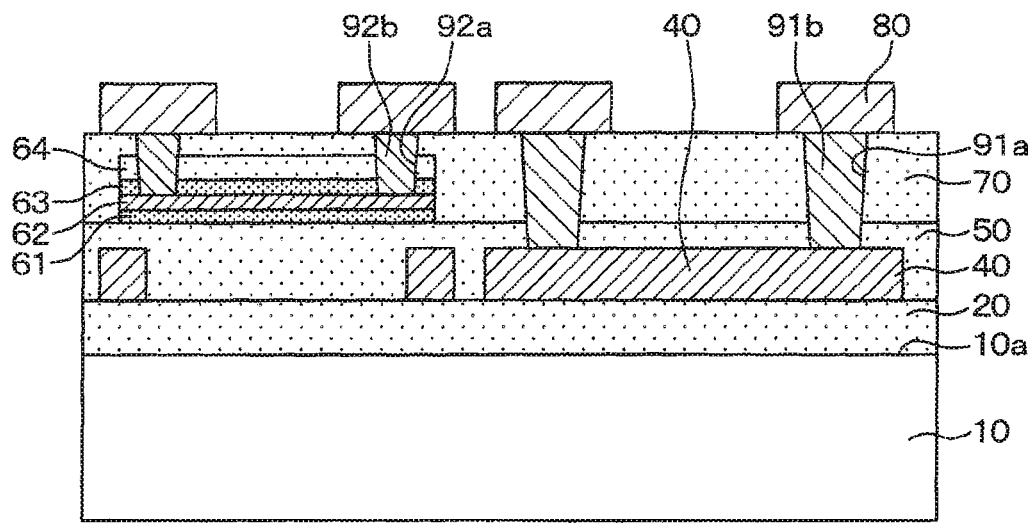
FIG. 8A and FIG. 8B are sectional views showing the manufacturing process of the semiconductor device continued from FIG. 7C.
Figure 8B:
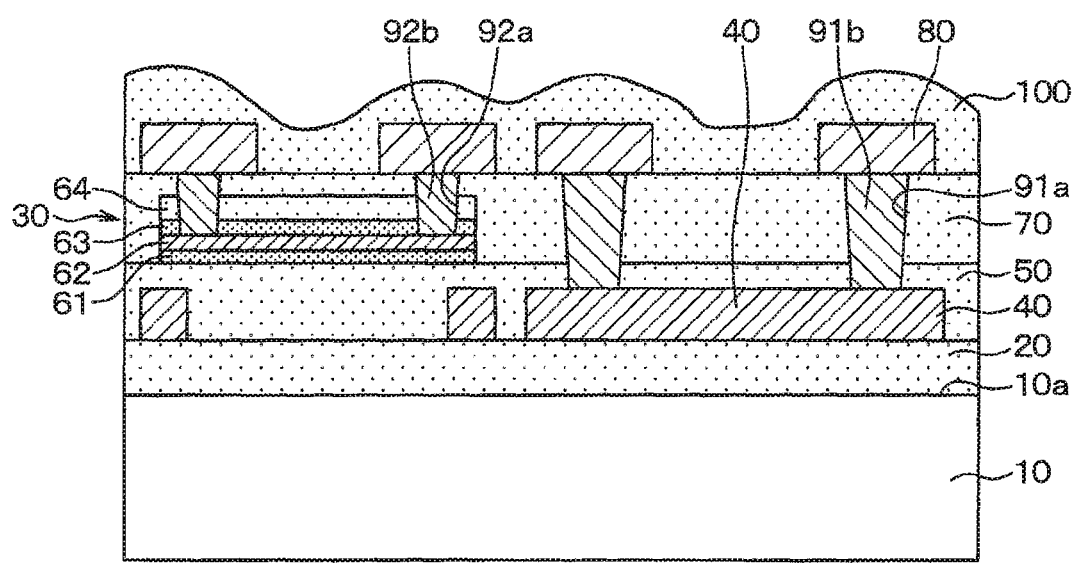

Subsequently, as is shown in FIG. 8A, the second wiring layer 80 in the shape described above is provided by subjecting the metal film 90b on the third insulating film 70 to patterning by means of photolithography or the like using a predetermined mask. That is to say, the thin-film resistor 62 and the second wiring layer 80 are provided, respectively, in the step of FIG. 5D and the step of FIG. 8A in such a manner that the thin-film resistor 62 partially overlaps the second wiring layer 80 at the end portions. Subsequently, as is shown in FIG. 8B, the protection film 100 is provided so as to cover the second wiring layer 80 by means of HDP (High Density Plasma) or the like.

Herein, as in the step of FIG. 6A, the thin-film resistor 62 may possibly become oxidized when moisture contained in the protection film 100 migrates. In the present embodiment, however, it should be noted that the end portions of the thin-film resistor 62 and the second wiring layer 80 overlap each other when viewed in a direction normal to the one surface 10a of the substrate 10. That is to say, the second wiring layer 80 is disposed in the protection film 100 in portions near the side surfaces of the thin-film resistor 62.

Hence, in comparison with a case where the second wiring layer 80 is not provided in the portions specified above, moisture does not migrate from the portions specified above and moisture that reaches the side surfaces of the thin-film resistor 62 can be restricted, which can in turn restrict oxidation on the side surfaces of the thin-film resistor 62. The semiconductor device shown in FIG. 1 is manufactured in the manner as above. In the step of FIG. 8B, moisture in the first insulating film 50 may also possibly migrate. However, as has been described above, oxidation of the thin-film resistor 62 caused by moisture in the first insulating film 50 is restricted by the first wiring layer 40.

As has been described, in the present embodiment, the end portions of the thin-film resistor 62 and the first wiring layer 40 partially overlap (intersect with) each other when viewed in a direction normal to the one surface 10a of the substrate 10. That is to say, the first wiring layer 40 is disposed in the first insulating film 50 in portions near the side surfaces of the thin-film resistor 62. Hence, in comparison with a case where the first wiring layer 40 is not provided in the portions specified above, moisture does not migrate from the portions specified above in times such as when the third insulating film 70 is provided, when the metal films 90a and 90b are deposited, when the insulating film 100 is provided, and when the semiconductor device is in use, and moisture that reaches the side surfaces of the thin-film resistor 62 can be restricted, which can in turn restrict oxidation on the side surfaces of the thin-film resistor 62. Consequently, a variance in resistance value of the thin-film resistor 62 can be restricted.

A result of a test conducted by the inventors will now be described with reference to FIG. 9A through FIG. 9C and FIG. 10. FIG. 10 is a view showing a variation ($3\sigma$) in resistance value when the thin-film resistor 62 is provided so as to have a resistance value of 6.7 k$\Omega$.

Figure 9A:
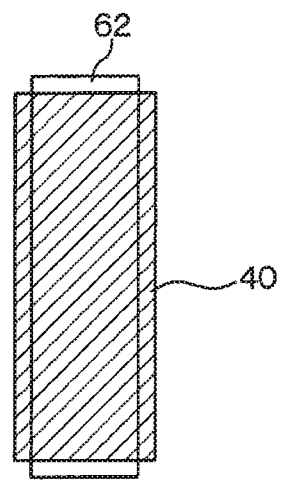
FIG. 9A is a view showing a positional relation of the thin-film resistor and the first wiring layer when viewed in a direction normal to the one surface of the substrate.
Figure 9B:
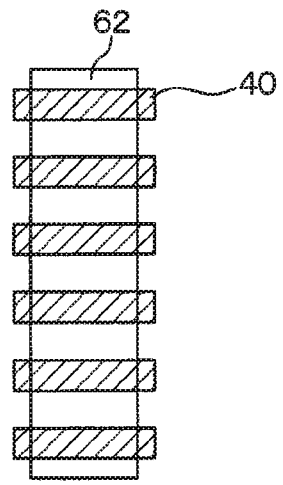
FIG. 9B is a view showing another positional relation of the thin-film resistor and the first wiring layer when viewed in a direction normal to the one surface of the substrate.
Figure 9C:
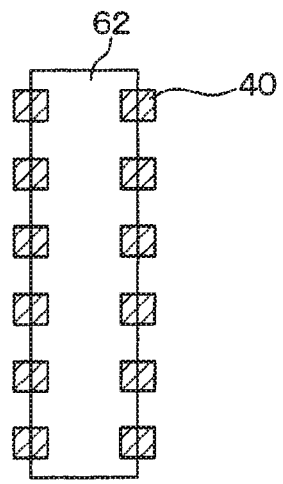
FIG. 9C is a view showing still another positional relation of the thin-film resistor and the first wiring layer when viewed in a direction normal to the one surface of the substrate.
Figure 10:
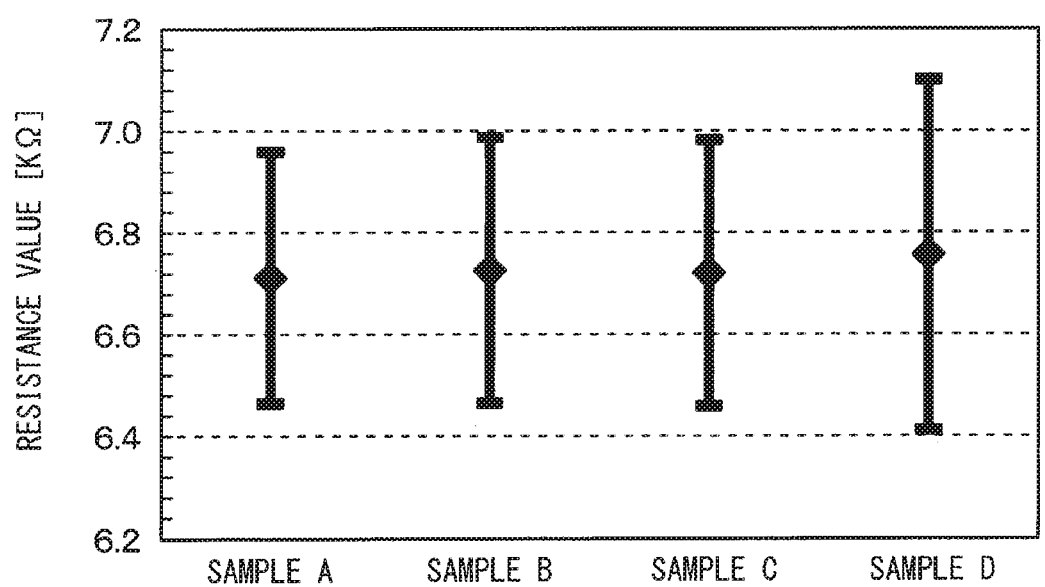
FIG. 10 is a view showing a relation of various samples and a variation in resistance value.

A variation in resistance value of Sample A of FIG. 10 indicates a variation when the thin-film resistor 62 and the first wiring layer 40 are provided as is shown in FIG. 9A. That is to say, Sample A indicates a variation in resistance value of the thin-film resistor 62 in a semiconductor device in which, when viewed in a direction normal to the one surface 10a of the substrate 10, the thin-film resistor 62 is formed in a rectangular shape and both end portions of the thin-film resistor 62 in a longitudinal direction (top-bottom direction on a sheet surface of FIG. 9) are exposed from the first wiring layer 40.

A variation in resistance value of Sample B of FIG. 10 indicates a variation when the thin-film resistor 62 and the first wiring layer 40 are provided as is shown in FIG. 9B. That is to say, Sample B indicates a variation in resistance value of the thin-film resistor 62 in a semiconductor device in which, when viewed in a direction normal to the one surface 10a of the substrate 10, the first wiring layer 40 shown in FIG. 9A is divided to multiple segments in a direction in which the thin-film resistor 62 extends.

Sample C of FIG. 10 indicates a variation when the thin-film resistor 62 and the first wiring layer 40 are provided as is shown in FIG. 9C. That is to say, Sample C indicates a variation in resistance value of the thin-film resistor 62 in a semiconductor device in which, when viewed in a direction normal to the one surface 10a of the substrate 10, the first wiring layer 40 shown in FIG. 9B is removed in a portion opposing an inner edge portion of the thin-film resistor 62. In other words, Sample C indicates a variation in resistance value of the thin-film resistor 62 in a semiconductor device in which, when viewed in a direction normal to the one surface 10a of the substrate 10, the first wiring layer 40 shown in FIG. 2 is divided to multiple segments in the direction in which the thin-film resistor 62 extends.

Among Samples A through C of FIG. 10, when viewed in a direction normal to the one surface 10a of the substrate 10, an overlapping ratio of the end portions of the thin-film resistor 62 and the first wiring layer 40 is highest in Sample A and equal in Sample B and Sample C. FIG. 9A through FIG. 9C are not sectional views. However, the first wiring layer 40 is shaded for ease of understanding.

Sample D of FIG. 10 indicates a variation in resistance value when the first wiring layer 40 is not provided so as to overlap the end portions of the thin-film resistor 62.

As is shown in FIG. 10, it is confirmed that a variation in resistance value is smaller in Samples A through C than in Sample D. That is to say, it is confirmed that when the first wiring layer 40 is provided so as to overlap the end portions of the thin-film resistor 62, the side surfaces of the thin-film resistor 62 hardly become oxidized and hence a variation in resistance value becomes smaller.

Among Samples A through C, it is further confirmed that a variation in resistance value is smallest in Sample A having a highest overlapping ratio of the end portions of the thin-film resistor 62 and the first wiring layer 40 and equal in Sample B and Sample C having equal overlapping ratios of the end portions of the thin-film resistor 62 and the first wiring layer 40. That is to say, it is confirmed from Samples A through C that a variation in resistance value becomes smaller as an overlapping ratio of the end portions of the thin-film resistor 62 and the first wiring layer 40 becomes higher. It is also confirmed from Samples B and C that even in a case where a shape of the first wiring layer 40 is changed, a variation in resistance value becomes equal when an overlapping ratio of the end portions of the thin-film resistor 62 and the first wiring layer 40 is equal.

In the present embodiment, when viewed in a direction normal to the surface 10a of the substrate 10, the end portions of the thin-film resistor 62 and the second wiring layer 80 partially overlap each other. That is to say, the second wiring layer 80 is disposed in the protection film 100 in portions near the side surfaces of the thin-film resistor 62. Hence, in comparison with a case where the second wiring layer 80 is not provided in the portions specified above, moisture does not migrate from the portions specified above in times such as when the protection film 100 is provided and when the semiconductor device is in use, and moisture that reaches the side surfaces of the thin-film resistor 62 can be restricted, which can in turn restrict oxidation on the side surfaces of the thin-film resistor 62. That is to say, a variance in resistance value of the thin-film resistor 62 can be restricted further.

The semiconductor device can be manufactured by merely changing a shape of masks used when the first wiring layer 40, the thin-film resistor 62, and the second wiring layer 80 are subjected to patterning. That is to say, oxidation of the thin-film resistor 62 can be restricted without increasing the number of steps and complexity of the manufacturing process.

In the present embodiment, when viewed in a direction normal to the one surface 10a of the substrate 10, a center portion of the thin-film resistor 62 is prevented from overlapping the first wiring layer 40 and the second wiring layer 80. Hence, another wiring layer can be provided in a portion opposing the center portion of the thin-film resistor 62 and a degree of freedom in layout can be increased. In addition, because the center portion of the thin-film resistor 62 does not overlap the first wiring layer 40 and the second wiring layer 80, a resistance value of the thin-film resistor 62 can be readily adjusted by means of, for example, laser trimming by which a laser beam is irradiated from a side of the one surface 10a of the substrate 10. Further, because the center portion of the thin-film resistor 62 does not overlap the first wiring layer 40 and the second wiring layer 80, an occurrence of potential interference among the thin-film resistor 62, the first wiring layer 40, and the second wiring layer 80 can be restricted. Furthermore, generation of a parasitic capacity between the thin-film resistor 62 and the first wiring layer 40 and between the thin-film resistor 62 and the second wiring layer 80 can be also restricted.

Second Embodiment

A second embodiment of the present disclosure will be described. The present embodiment is different from the first embodiment above in that multiple thin-film resistors 62 are provided and paired resistance is formed using the multiple thin-film resistors 62. A rest of the present embodiment is same as the first embodiment above and a description is not repeated herein.

Figure 11:
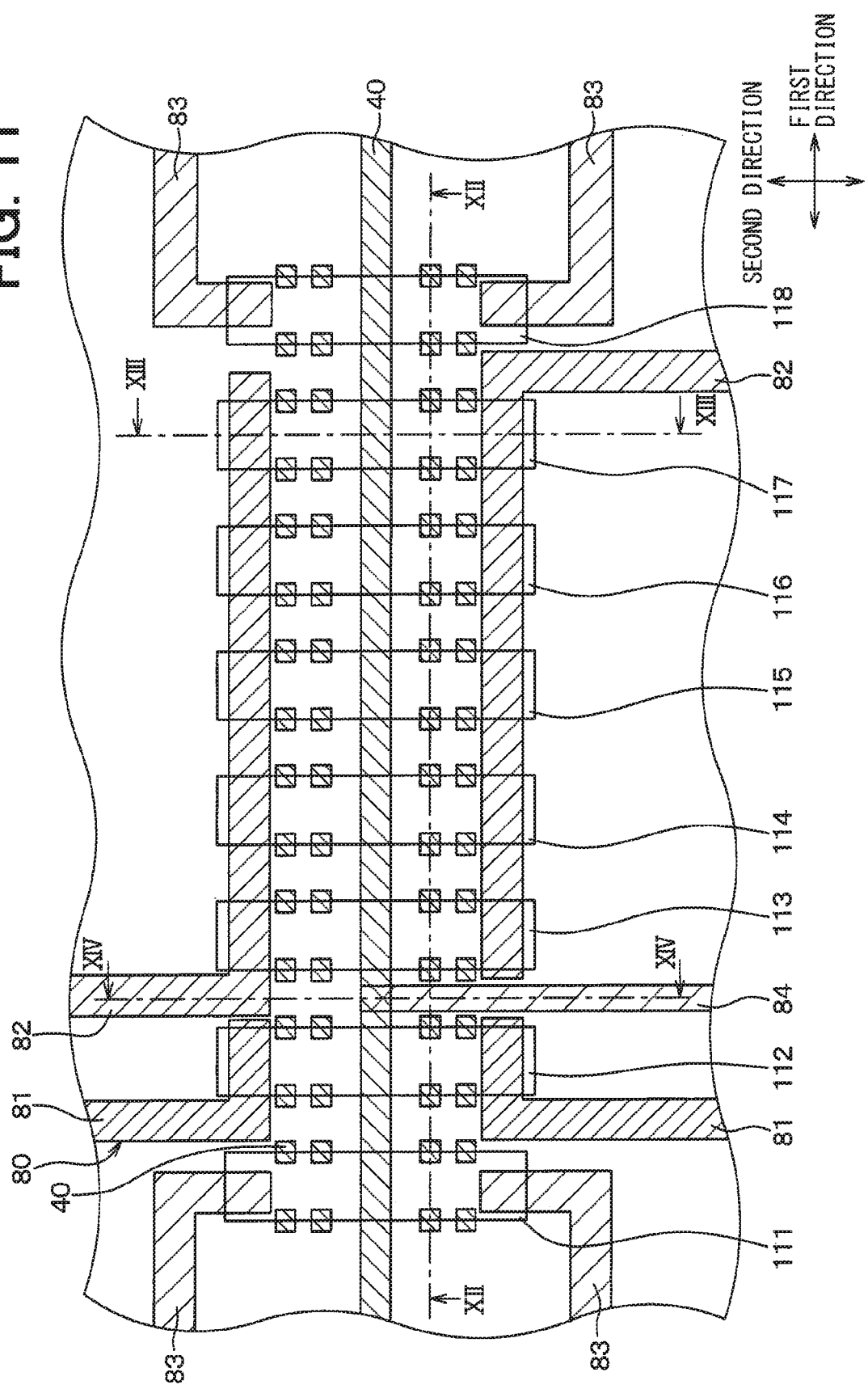
FIG. 11 is a top view of a semiconductor device according to a second embodiment of the present disclosure when viewed in a direction normal to one surface of a substrate.

FIG. 11 is a top view of a semiconductor device of the present embodiment and shows a positional relation of first and second wiring layers 40 and 80 and thin-film resistors 111 through 118. FIG. 11 is not a sectional view. However, the first and second wiring layers 40 and 80 are shaded and a protection film 100 is omitted for ease of understanding.

In the present embodiment, as is shown in FIG. 11, the first through eighth thin-film resistors 111 through 118 are provided sequentially along a first direction (right-left direction on a sheet surface of FIG. 11) in a plane direction of a substrate 10. Each of the first through eighth thin-film resistors 111 through 118 is of a same rectangular shape (same size) having a longitudinal direction along a second direction (top-bottom direction on the sheet surface of FIG. 10) orthogonal to the first direction.

Figure 12:
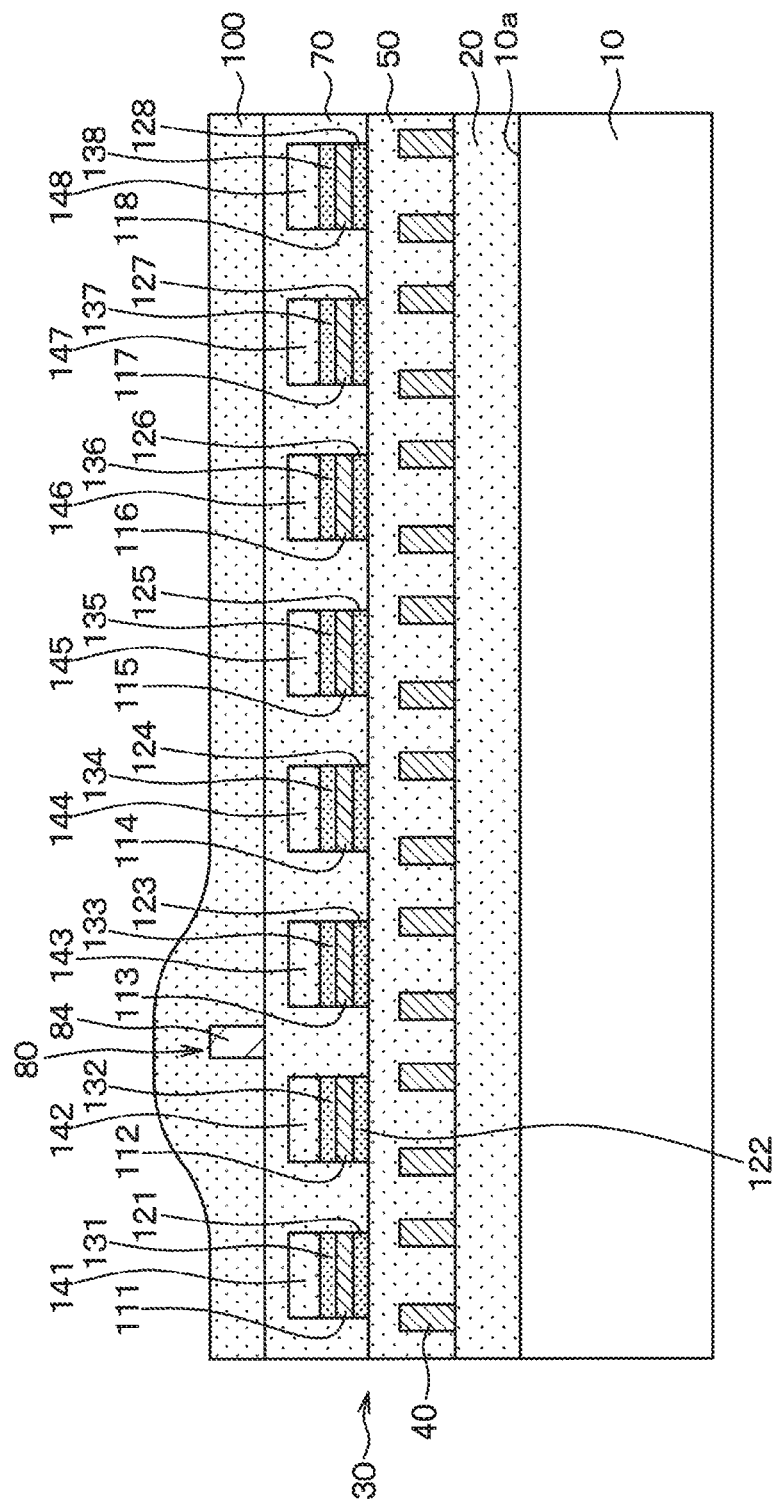
FIG. 12 is a sectional view taken along the line XII-XII of FIG. 11.
Figure 13:
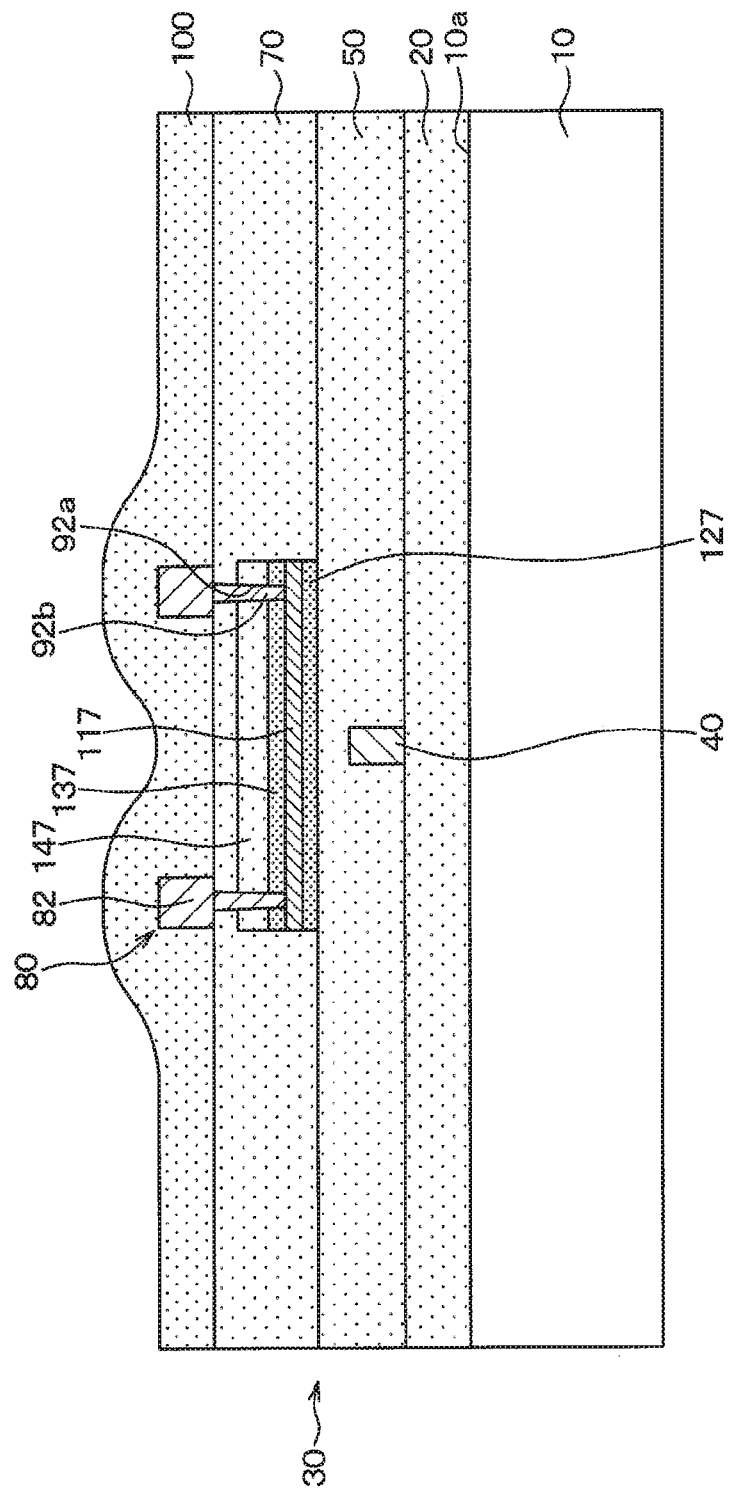
FIG. 13 is a sectional view taken along the line XIII-XIII of FIG. 11.

As are shown in FIG. 12 and FIG. 13, first through eighth lower oxidation preventing films 121 through 128 are disposed beneath the first through eighth thin-film resistors 111 through 118, respectively. First through eighth upper oxidation preventing films 131 through 138 and insulating films 141 through 148 are sequentially disposed on the first through eighth thin-film resistors 111 through 118, respectively.

As is shown in FIG. 13, the seventh thin-film resistor 117 is electrically connected to the second wiring layer 80 via connection vias 92b at both end portions in the second direction. Although it is not particularly shown in the drawings, each of the first through sixth and eighth thin-film resistors 111 through 116 and 118 is electrically connected to the second wiring layer 80 via the connection vias 92b at both end portions in the second direction.

Figure 15A:
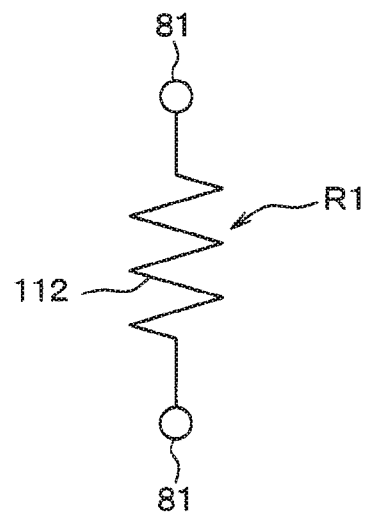
FIG. 15A is a circuit diagram showing a first voltage-dividing resistor.
Figure 15B:
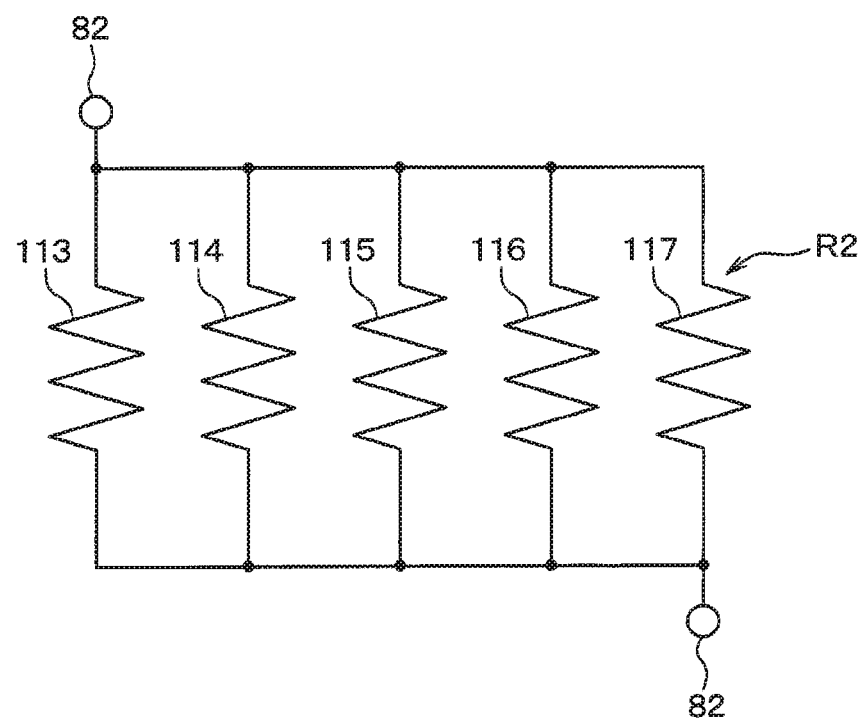
FIG. 15B is a circuit diagram showing a second voltage-dividing resistor.

In the present embodiment, as are shown in FIG. 11, FIG. 15A, and FIG. 15B, the second through seventh thin-film resistors 112 through 117 among the first through eighth thin-film resistors 111 through 118 are used as paired resistance forming first and second voltage-dividing resistors R1 and R2 at a resistance value ratio of 5:1. The first and eighth thin-film resistors 111 and 118 are used as normal wiring resistance. The term, "paired resistance", referred to herein means a set of voltage-dividing resistors used in connection with an operational amplifier or the like to divide (split) a predetermined voltage.

The paired resistance of the present embodiment will now be described more specifically. The first voltage-dividing resistor R1 is formed by connecting the second thin-film resistor 112 to an extraction wiring layer 81 of the second wiring layer 80. The second voltage-dividing resistor R2 is formed by connecting the third through seventh thin-film resistors 113 through 117 in parallel to an extraction wiring layer 82 of the second wiring layer 80. Consequently, the first and second voltage-dividing resistors R1 and R2 at a resistance value ratio of 5:1 are formed in the present embodiment. The first and eighth thin-film resistors 111 and 118 are connected to an extraction wiring layer 83 of the second wiring layer 80 and form normal wring resistance.

Further, in the present embodiment, as are shown in FIG. 11 and FIG. 12, the first wiring layer 40 is provided so as to overlap end portions of the respective first through eighth thin-film resistors 111 through 118 when viewed in a direction normal to one surface 10*a* of the substrate 10. To be more specific, when viewed in a direction normal to the one surface 10*a* of the substrate 10, the first wiring layer 40 is provided so as to overlap the end portions of the respective second through seventh thin-film resistors 112 through 117 at equal overlapping ratios (intersecting ratios). That is to say, the first wiring layer 40 is provided to have equal overlapping ratios (intersecting ratios) with the respective thin-film resistors 112 through 117 forming the paired resistance.

Likewise, when viewed in a direction normal to the one surface 10*a* of the substrate 10, the second wiring layer 80 is provided so as to overlap the respective thin-film resistors 112 through 117 forming the paired resistance at equal overlapping ratios (intersecting ratios).

As in the first embodiment above, a part of the first wiring layer 40 is electrically connected to the second wiring layer 80 via a connection via 91*b* as is shown in FIG. 14.

As has been described, in the present embodiment, the paired resistance is formed using the second through seventh thin-film resistors 111 through 117. Overlapping ratios of the end portions of the respective second through seventh thin-film resistors 112 through 117 and the first wiring layer 40 are adjusted to be equal. Also, overlapping ratios of the end portions of the respective second through seventh thin-film resistors 111 through 117 and the second wiring layer 80 are adjusted to be equal. Hence, when the second through seventh thin-film resistors 112 through 117 become oxidized, each thin-film resistor becomes oxidized and a resistance value varies in a same manner. Consequently, a variance in resistance value ratio of the paired resistance can be restricted.

The first through eighth thin-film resistors 111 through 118 are disposed sequentially along the first direction of the substrate 10 and the paired resistance is formed using the second through seventh thin-film resistors 112 through 117 on an inner side of the first and eighth thin-film resistors 111 and 118 positioned at both end portions in the first direction. Hence, a variance in resistance value ratio of the paired resistance from a desired value can be restricted. More specifically, the first through eighth thin-film resistors 111 through 118 are provided when subjected to patterning by means of photolithography or the like as described above. However, a line width of the thin-film resistor finished by means of photolithography differs between a dense wiring portion and a non-dense wiring portion due to a halation effect. During etching, an etching rate differs between the dense wiring portion and the non-dense wiring portion due to a micro-loading effect. Hence, machining accuracy may possibly differ between the dense wiring portion and the non-dense wiring portion. That is to say, the first and eighth thin-film resistors 111 and 118 and the second through seventh thin-film resistors 112 through 117 may possibly have different resistance values even when each thin-film resistor is provided so as to have a same resistance value. Accordingly, by forming the paired resistance using the second through seventh thin-film resistors 112 through 117, highly-accurate paired resistance can be formed.

The semiconductor device as above can be manufactured by a same manufacturing method as the first embodiment above by changing shapes in respective patterning steps as needed.

Other Embodiments

The respective embodiments above have described a case where the first and second wiring layers 40 and 80 are disposed inside the multi-layer wiring layer 30. However, for example, multiple wiring layers may be additionally disposed inside the multi-layer wiring layer 30.

In the respective embodiments above, the second wiring layer 80 may not have portions overlapping the end portions of the thin-film resistors 62 when viewed in a direction normal to the one surface 10*a* of the substrate 10.

In the respective embodiments above, a wiring layer may be disposed on the first insulating film 50 in close proximity to the side surfaces of the thin-film resistor 62. According to the configuration as above, moisture does not migrate from a portion where the wiring layer is disposed in times such as when the third insulating film 70 is provided, when the metal films 90*a* and 90*b* are deposited, when the protection film 100 is provided, and when the semiconductor device is in use. Consequently, oxidation on the side surfaces of the thin-film resistor 62 can be restricted further.

In the respective embodiments above, the thin-film resistor 62 is not necessarily of a rectangular shape and may be of a circular shape or an elliptical shape instead.

In the respective embodiments above, when viewed in a direction normal to the one surface 10*a* of the substrate 10, the overlapping portions of the first wiring layer 40 and the thin-film resistor 62 are not necessarily symmetrical with respect to a center line extending in the direction in which the thin-film resistor 62 extends by passing a center of the thin-film resistor 62. Likewise, although it is not particularly shown in the drawings, a shape of the second wiring layer 80 may also be changed as needed.

In the second embodiment above, a shape of the first wiring layer 40 can be changed as needed as long as the end portions of the respective second through seventh thin-film resistors 112 through 117 and the first wiring layer 40 overlap at equal overlapping ratios (intersecting ratios) when viewed in a direction normal to the one surface 10*a* of the substrate 10. That is to say, in FIG. 11, the first wiring layer 40 overlaps the respective thin-film resistors 62 in a same shape when viewed in a direction normal to the one surface 10*a* of the substrate 10. However, a design of the first wiring layer 40 can be changed without any restriction as long as the end portions of the respective thin-film resistors 62 and the first wiring layer 40 overlap at equal overlapping ratios (see FIG. 9A through FIG. 9C and FIG. 10).

In the respective embodiments above, the first wiring layer 40 may be provided in a frame shape so as to be superimposed (placed) on the end portions of the thin-film resistor 62 when viewed in a direction normal to the one surface 10*a* of the substrate 10. When configured in such a manner, oxidation of the thin-film resistor 62 can be restricted further, which can in turn further restrict a variance in resistance value of the thin-film resistor 62. Likewise, when viewed in a direction normal to the one surface 10*a* of the substrate 10, the second wiring layer 80 may be provided in a frame shape so as to be superimposed (placed) on the end portions of the thin-film resistor 62.

In the second embodiment above, the third through seventh thin-film resistors 113 through 117 may be connected in series and the paired resistance may be formed using the second thin-film resistor 112 and the third through seventh thin-film resistors 117.

In the second embodiment above, the paired resistance may be formed by including the first and eighth thin-film resistors 111 and 118.

In the second embodiment above, the respective second through eighth thin-film resistors 112 through 117 forming the paired resistance may overlap the first wiring layer 40 at different overlapping ratios and the respective second through seventh thin-film resistors 112 through 117 may overlap the second wiring layer 80 at different overlapping ratios. Even in the semiconductor device configured as above, when viewed in a direction normal to the one surface 10a of the substrate 10, the end portions of the respective second through seventh thin-film resistors 112 through 117 overlap the first wiring layer 40 in the same manner as in the first embodiment above. Consequently, a variance in resistance value can be restricted and hence a variance in resistance value ratio of the paired resistance can be restricted, too.

In the second embodiment above, the paired resistance is not necessarily formed of two voltage-dividing resistors and may be formed of three or more voltage-dividing resistors.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. A semiconductor device comprising:
    a substrate having a first surface;
    a first wiring layer arranged above the first surface of the substrate;
    a first insulating film covering the first wiring layer;
    a lower oxidation preventing film arranged on the first insulating film;
    a plurality of thin-film resistors arranged on the lower oxidation preventing film;
    an upper oxidation preventing film arranged on the plurality of thin-film resistors;
    a second insulating film covering the lower oxidation preventing film, the plurality of thin-film resistors, and the upper oxidation preventing film;
    a second wiring layer arranged on the second insulating film that covers the lower oxidation preventing film, the plurality of thin-film resistors, and the upper oxidation preventing film; and
    a third insulating film covering the second wiring layer, wherein:
        a sidewall of each of the plurality of thin-film resistors contacts the second insulating film;
        the plurality of the thin-film resistors are sequentially arranged along one direction in a plane direction of the substrate;
        the plurality of thin-film resistors provide a pair resistor, functioning as first and second voltage dividing resistors, that divides a predetermined voltage;
        the pair resistor is provided by a part of the plurality of the thin-film resistors, the part being positioned on an inner side of two of the plurality of the thin-film resistors arranged at both ends of the plurality of the thin-film resistors in the one direction;
        at least one of the first and second voltage dividing resistors of the pair resistor is provided by multiple thin-film resistors which are electrically connected in parallel to each other;
        the first wiring layer overlaps an end portion of each of the plurality of thin-film resistors when viewed in a normal direction of the first surface of the substrate;
        the first wiring layer overlaps at least a part of a longer side of each of the plurality of thin-film resistors along an extension direction in which each of the plurality of thin-film resistors extends and does not overlap a shorter side of each of the plurality of thin-film resistors along a direction different from the extension direction;
        a longitudinal direction of the first wiring layer is parallel with a longitudinal direction of each of the plurality of thin-film resistors;
        the extension direction is the longitudinal direction of each of the plurality of thin film resistors;
        the first wiring layer includes a plurality of first wiring layers; and
        the longitudinal direction of each of the plurality of first wiring layers is parallel with the longitudinal direction of each of the plurality of thin-film resistors.

2. The semiconductor device according to claim 1, wherein:
    when viewed in the normal direction of the first surface of the substrate, the second wiring layer overlaps the end portion of each of the plurality of thin-film resistors.

3. The semiconductor device according to claim 1, wherein:
    when viewed in the normal direction of the first surface of the substrate, overlapping ratios between the plurality of thin-film resistors providing the pair resistor and the plurality of first wiring layers are equal to each other.

4. The semiconductor device according to claim 1, wherein:
    each of the plurality of thin-film resistors includes a first longer side and a second longer side;
    the first longer side overlaps only one of the plurality of first wiring layers; and
    the second longer side overlaps only another of the plurality of first wiring layers.

* * * * *